United States Patent [19]

Ishigami et al.

[11] 3,943,883
[45] Mar. 16, 1976

[54] UHF TUNER CHANNEL INDICATING DEVICE

[75] Inventors: Hideo Ishigami, Yokosuka; Masaaki Goto, Yokohama, both of Japan

[73] Assignee: Hitachi, Ltd., Japan

[22] Filed: Dec. 18, 1973

[21] Appl. No.: 425,709

[30] Foreign Application Priority Data
Dec. 23, 1972   Japan.................................. 47-2980

[52] U.S. Cl........... 116/124.1 R; 116/124.4; 334/86
[51] Int. Cl.² .............................................. H03J 1/02
[58] Field of Search... 116/124.1 R, 124.2 R, 124.3, 116/124.4, DIG. 29; 235/103, 1 A, 117 A, 139 A, 1 C, 139 A; 74/10.22, 10.8, 10.45; 334/87, 86; 325/455, 464; 58/125 C, 126 E

[56] References Cited
UNITED STATES PATENTS

| | | | |
|---|---|---|---|
| 1,909,740 | 5/1933 | Zubaty............................ | 235/139 A |
| 2,738,758 | 3/1956 | Cutler............................. | 116/DIG. 29 |
| 2,762,190 | 9/1956 | Holzner........................... | 58/125 C X |
| 2,903,894 | 9/1959 | Legros............................. | 334/87 X |
| 3,376,846 | 4/1968 | Sekiguchi et al. ................ | 116/124.1 |
| 3,618,561 | 11/1971 | Wallis et al...................... | 334/86 |
| 3,708,114 | 1/1973 | Johnson........................... | 116/124.1 |

FOREIGN PATENTS OR APPLICATIONS

320,014   10/1929   United Kingdom............. 235/139 A

*Primary Examiner*—Richard C. Queisser
*Assistant Examiner*—Daniel M. Yasich
*Attorney, Agent, or Firm*—Craig & Antonelli

[57] ABSTRACT

There is disclosed a UHF tuner channel indicating device adapted for use in a television receiver. In this device, two drums which carry digits in the unit digit and tens digit, respectively, for indicating channel numbers, are placed coaxially with each other and rotatably, with the drum carrying the unit digits being placed inwardly of the other drum, said drums being coupled to a rotary device of a tuner, whereby one turn of the unit-digit carrying drum causes the tens digit carrying drum to rotate by one-tenth turn by means of an intermittent shifting mechanism, thereby indicating a channel number in two digits.

8 Claims, 10 Drawing Figures

UHF TUNER CHANNEL INDICATING DEVICE

This invention relates to a channel indicating device for use in a television receiver, and more particularly to a channel indicating device for a UHF detent tuner which deals with a plurality of channels and is adapted to switch from one channel to another and select same intermittently but positively.

DESCRIPTION OF THE PRIOR ART

At the present time, 12 channels in a VHF frequency zone and 70 channels in UHF frequency zone are commonly alloted for television broadcasting. The VHF tuner adapted to receive 12 channels in the VHF frequency zone, selects a desired channel through progressive tunning, while the UHF tuner adapted to receive 70 channels in the UHF frequency zone, selects a desired channel through continuous tunning. In UHF tuners, 70 channels are covered in a rotational angle of about 180° of a variable condensor, and thus an angle alloted to one channel is no more than 2.5°, presenting difficulties with selecting channels. Accordingly, it is desired that progressive and detent type channel selection such as in VHF tuner be applied to UHF tuner.

However, in providing a progressive and detent type UHF tuner, there remain problems of how to indicate a selected channel out of 70 channels definitely or how to associate such an indicating method with the tuner.

It is an object of the invention to provide a device for indicating a selected channel number definitely, for UHF tuner having detent means for each of 70 channels.

According to a channel indicating device of the present invention, there are provided a pair of drums, on which are printed digits from 0 to 9 or on which is attached a paper or the like having digits printed thereon, whereby a number in one or two digits may be indicated thereon, said pair of drums being placed coaxially with each other and rotatably, with the drum which carries digits in the unit digit place being placed inwardly of the other and being coupled to a rotary device of a tuner, whereby one turn of the unit-digit carrying drum causes the tens-digit carrying drum to rotate by one-tenth turn by means of an intermittent shifting mechanism, thereby indicating a channel number in two digits.

Figure 1:
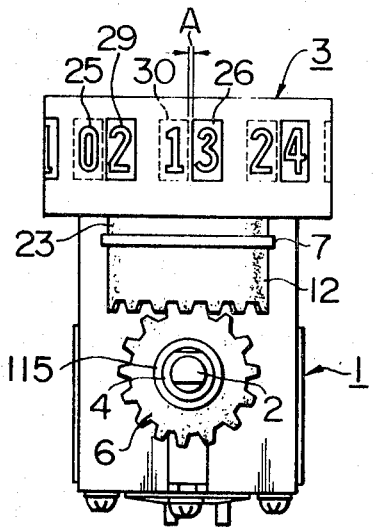
FIG. 1 is a plan view of a UHF tuner embodying the present invention.

The above mentioned and other objects and features will become apparent from the following detailed description taken in conjunction with the drawings which indicate embodiments of the invention.

In the drawing, shown at 1 is a tuner body covering the whole UHF television zone by rotating a tuner shaft through an angle of 180°, and the aforesaid tuner may be roughly adjusted by rotating a channel switching shaft 2, while watching a channel indicating device 3, and may be closely adjusted through rotation of a close adjusting shaft 4.

Figure 2:
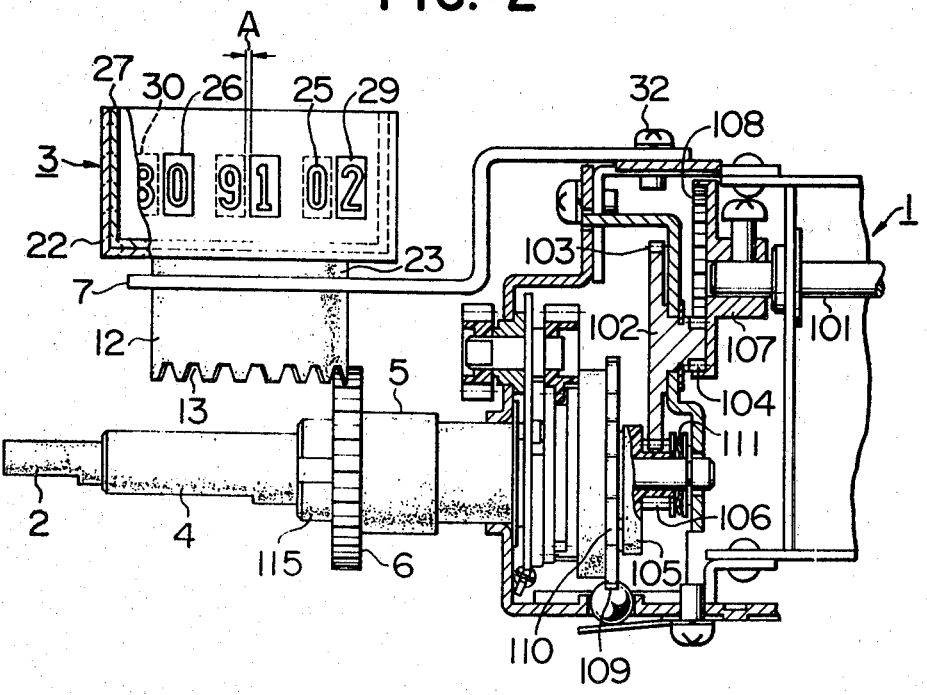
FIG. 2 is a side view of FIG. 1.

As shown in FIG. 2, a shaft 101 of the tuner 1 is coupled by way of an idler gear 102 to the channel switching shaft 2. The idler gear 102 consists large and small gears 103 and 104, while the large gear 103 meshes with a gear 106 on a gear 105 having a pin, said gear 105 being journaled on the channel switching shaft 2. The small gear 104 meshes with an internal gear 108 on a variable-condensor gear 107. Shown at 109 is a switching cam having ten cam-projections 110, and the aforesaid cam is fixed on the channel switching shaft 2. The channel switching shaft may be rotated intermittently but with the aid of the cam-projections 110. The gear 105 having a pin is urged against the switching cam 109 under a frictional force of a wave washer 111, whereby the gear 105 may be rotated together with the channel switching shaft 2.

The rotational movement of the channel switching shaft 2 is transmitted through gear 105 having a pin to the idler gear 102, after which the rotation is decelerated and transmitted to variable-condensor gear 107 to thereby rotate the gear 107, resulting in the rotation of the tuner shaft 101.

Figure 3:
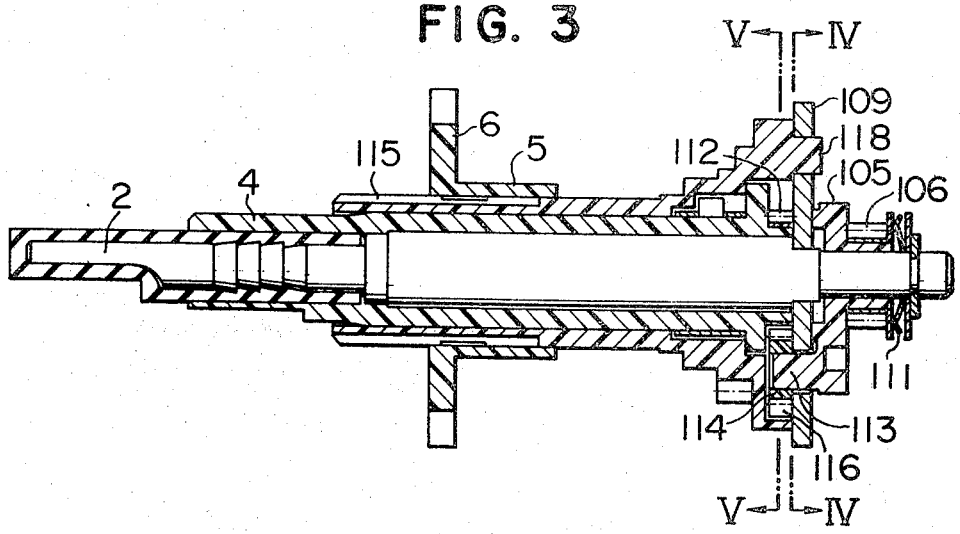
FIG. 3 is an enlarged, longitudinal cross-sectional view of a rotary mechanism.
Figure 5:
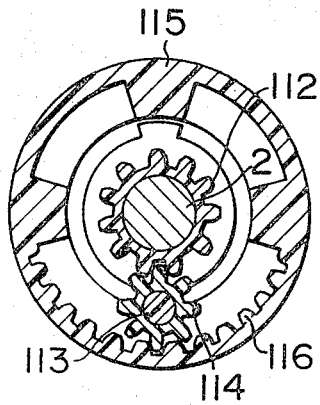
FIG. 5 is a cross-sectional view taken along the line V—V of FIG. 3.

The gear ratio of gear 106, of gear 105 having a pin, large and small gears 103 and 104 of idler gear 102 and internal gear 108 of the variable-condensor gear 107 is so selected that several turns of the channel switching shaft 2 may lead to the coverage of the entire frequency zone of the tuner 1, while the switching cam 109 is split into 10 divisions. As has already been clear, one cam projection 110 of the switching cam 109 is attendant on one channel, such that any desired channel may be selected by switching or turning the channel switching shaft 2, intermittently but positively, along the peripheral surface of the cam projections 110 of the switching cam 109. A close adjusting shaft 4 is fitted on the channel switching shaft 2. As shown in FIG. 3, the close adjusting shaft 4 is fitted on the channel switching shaft 2 in such a manner that the former may rotate together with the latter during the aforesaid intermittent rotation of the latter and that at the time of close adjustment, the former may rotate independently of the latter. Mounted on the tip portion of the close adjusting shaft 4 is a first gear 112, as shown in FIG. 5. The first gear 112 meshes with an epicyclic gear 114 which is fitted on a pin portion 113 of the gear 105 having a pin. The epicyclic gear 114 meshes with an internal gear 116 which is fitted on a dial shaft 115.

The pin portion 113 provided on the gear 105 having a pin fitted in an elongated hole 117 provided in a switching cam 109 (Refer to FIG. 4) in a manner to rotate independently of the switching cam 109. The extent of the rotation of the pin portion 113 is confined within the circumference of the elongated hole 117.

The close adjustment is carried out in the following manner.

When the close adjusting shaft 4 is rotated, the first gear 112 will be rotated. Then, the epicyclic gear 114 which meshes with the first gear 112 and the internal gear 116 mounted on the dial shaft 115 and is held herebetween, will be rotated in a direction opposite that of the first gear 112. As the epicyclic gear 114 rotates, the pin 113 moves along the elongated hole 117, together with the rotation of the epicyclic gear 114. The movement of the pin 113 will cause the gear 105 having a pin to rotate, whereby the idler gear 102 and variable-condensor gear 107 will be rotated, and thus the tuner shaft 101 will be rotated for close adjustment.

Figure 4:
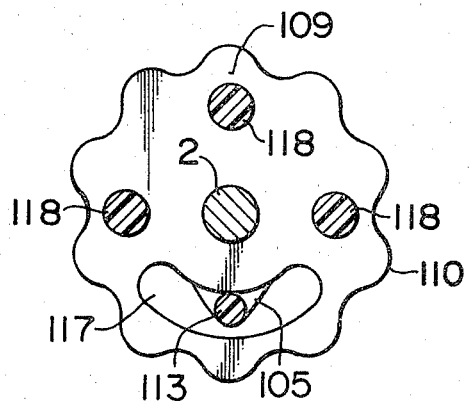
FIG. 4 is a cross-sectional view taken along the line IV—IV of FIG. 3.

The aforesaid dial shaft 115 is fitted on the close adjusting shaft 4 and fitted in the switching cam 109 by means of pin 118, as shown in FIG. 4. As a result, the dial shaft 115 rotates together with the channel switching shaft 2.

Figure 6A:
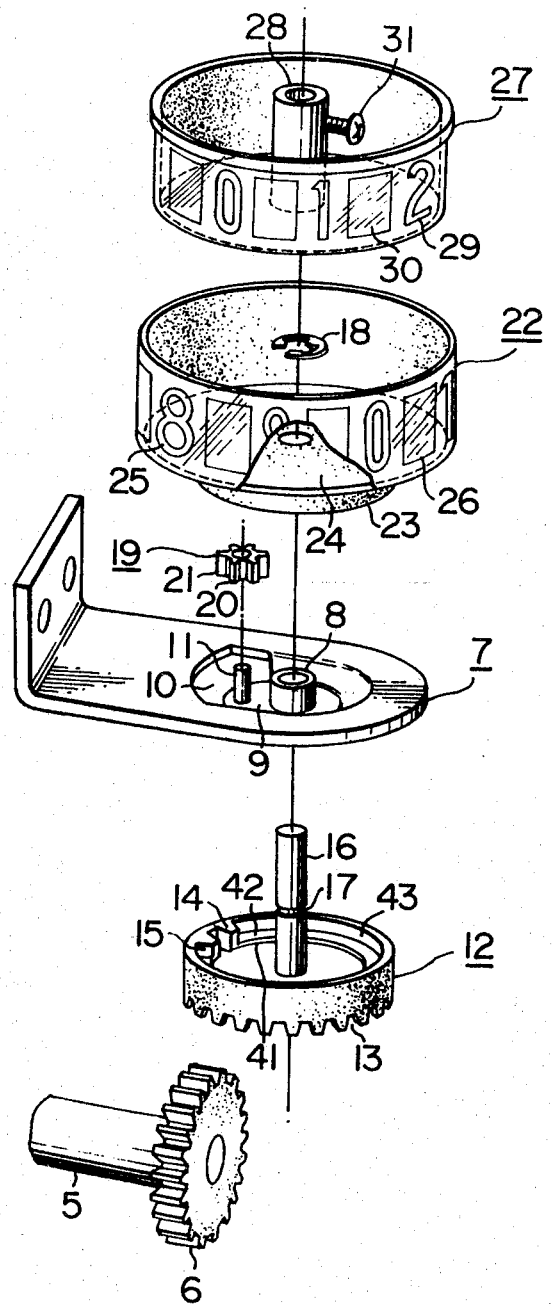
FIG. 6A is an exploded, perspective view of a channel indicating device.
Figure 6C:
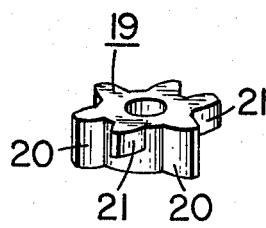
FIG. 6C is a perspective view of the intermittent feeding gear in the device of FIG. 6A.

As shown in FIGS. 1, 2 and 3, shown at 5 is a third shaft fitted on the outer circumference of the dial shaft 115, and the third shaft has a spur gear 6 at one end thereof. The third shaft 5 is rotated by and together with the rotation of the channel switching shaft 2. In FIG. 6A, there is shown at 7 a bracket having a boss hole 8 in its center, with the bottom surface of the boss hole being lowered from the flat surface of the bracket 7. On the other hand, there is provided a cut-out 10 in the flat portion of the bracket 7, while an upright pin 11 is provided on the bottom portion 9.

Designated at 12 is an indicator-drive-shaft having a crown gear 13 thereon at one end thereof. The crown gear 13 is so arranged as to mesh with the spur gear 6 affixed on the aforesaid third shaft 5 and has such a gear ratio that one divisional rotation of the channel switching shaft 2 will rotate an indicator drive shaft 12 by 1/10 turn. The indicator-drive-shaft 12 is formed with a gear shaped, shifting portions 14 and 15 (see FIG. 6A) on the inner side thereof and has a shaft 16 in its center, with said shaft 16 being formed with a groove 17. The indicator-drive-shaft 12 is rotatably fitted in the center hole 8, and prevented from withdrawal, by means of a E-ring 18 fitted in the groove 17.

Shown at 19 is an intermittent feeding gear having teeth of alternatively different lengths 20 and 21, thus presenting staggered alignment at respective one end thereof. The intermittent shifting gear 19 is rotatably fitted on the pin 11 and adapted to mesh with tooth shaped portions 14 and 15 on the indicator drive shaft 12, intermittently, such that one turn of the drive shaft 12 will cause one intermittent movement.

Figure 6B:
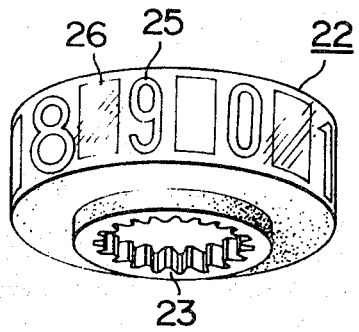
FIG. 6B is a perspective view of one element of the device in FIG. 6A.

Shown at 22 is a drum which indicates digits in the tens place and provided with a bottom having an internal gear 23 and a hole in its center. The drum 22 is made of a transparent material, and the outer peripheral surface thereof is formed with transparent digit portions in which there are left transparent digits 25 covering from 0 to 9, with the remaining portions being left opaque while there are provided a plurality of square transparent portions 26, with each of said transparent portions being positioned between the two transparent digit portions, and thus one can watch a digit in the unit place through the aforesaid transparent portion. In this case, the digits 25 and 26 may not be printed, and a film, tape or the like carrying such digits thereon may be wound around the aforesaid peripheral surface of a drum. In this respect, if the tape runs in contact with the inner peripheral surface of the drum 22, then there will result a lesser clearance between the digits in the unit and tens places, whereby improved sense of integrality of the binary digits may be provided. The indicator-drive-shaft 16 is rotatably fitted in the hole 24 in the drum 22, while the intermittent shifting gear 19 meshes with the internal gear 23 (FIG. 6B). It follows then that one turn of the indicator-drive-shaft 12 causes the rotation of the drum 22 by 1/10 turn by means of the intermittent mechanism, i.e., a digit in the tens place is shifted to the next position.

Shown at 27 is a drum which indicates digits in the unit place, and the drum 27 is made of a semi-transparent material, having a boss hole 28 in its center. The outer peripheral surface of the drum 27 is inserted within the drum 22 and rotatable therein. On the other hand, the outer peripheral portion of the drum 22 is formed with transparent portions 30, through which one can watch the digit 29 from 0 to 9 as well as the digit 25 in the second unit tens place, with the remaining portions being left opaque. The indicator-drive-shaft 16 is inserted in the boss hole 28 in the drum 27. The drums 22 and 27 are set so as to bring the position of the channel switching shaft 2 in alignment with the indication of a channel, after which the drum 27 is fixed on the shaft 16 by means of a screw 31 firmly. At the same time, the bracket 7 is fixed rigidly by means of a screw 32 to the tuner body 1, with the gear 6 being in mesh with the crown gear 13. In passing, when the drum 27 which carries digits in the unit place is to be assembled to the drum 22 which carries digits in the tens place, it is recommendable that a clearance A be provided between transparent portions 26 and 30, thereby preventing interference of the portion 26 with the portion 30.

As is apparent from the foregoing description, the rotation of gear 6 follows the intermittent rotation of the channel switching shaft 2 to thereby rotate the crown gear 13, such that the drum which carries digits in the unit place is rotated by 1/10 turn, commensurate to the one intermittent turn of the channel switching shaft 2, whereby digits will appear, one after another, in the transparent portion 26 of the drum 22 which carries digits in the tens place. When the drum 27 which carries digits in the unit place is rotated by one turn, the shifting-tooth shaped portion 14 and 15 on the indicator drive shaft 12 will mesh with a wide tooth shaped portion 20 of the intermittent shifting gear 19, and then the intermittent shifting gear 19 will be rotated by a distance corresponding to two teeth, such that the drum 22 which carries digits in the tens place will be rotated by 1/10 turn.

During the time other than the aforesaid case, the narrow tooth shaped portion 21 rests on the surface 42 of the ridge portion 41 on the indicator drive shaft 12, while two wide tooth shaped portions 20 are in contact with the inner surface of the ridge portion 41, with the result that the intermittent feeding gear 19 will not be allowed to rotate, with its position maintained constant. As a result, the drum which carries digits in the tens place will not be allowed to rotate. The channel indication will proceed in such a manner thereafter.

Figure 7:
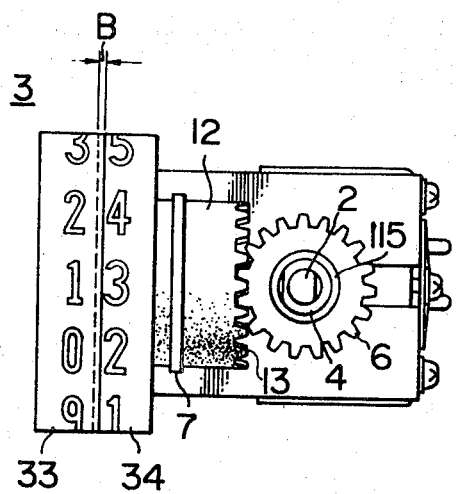
FIG. 7 is a plan view of another embodiment of the invention.
Figure 8:
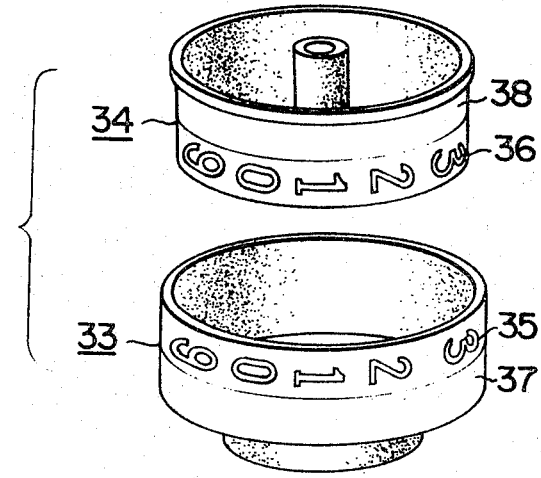
FIG. 8 is an exploded, perspective view of a channel indicating device of FIG. 7.

FIGS. 7 and 8 show another embodiment of the invention. The difference of the present embodiment from the previous lies in the construction of the indicating drums. In other words, according to the present embodiment, the direction of a rotary shaft of the drum is changed by an angle of 90°, whereby the digits to be indicated on the drum move in a vertical direction. The construction of the drums themselves and the mechanism for driving drums are substantially the same as those of the previous embodiment, except for the indicating method of digits on drums. The similar parts in FIG. 7 are given the same reference numerals as those in FIG. 1. The description will be given on the construction of the drums with reference to FIG. 8.

Shown at 33 and 34 are drums which carry digits in the tens and unit places, respectively, and hence correspond to drums 22 and 27, respectively. There are provided transparent digit portions on the outer peripheral portions thereof which carry transparent digits 35 and 36, with the remaining portion being left opaque, while there are provided transparent portions 37 and 38, through which one can watch digits 35 and 36, with respective remaining portion being printed.

In assembling of the drum 33 to the drum 34, it is recommendable to provide a small clearance B between transparent digit portions 33 and 34, as shown in FIG. 7.

With the aforesaid embodiments, a light source is placed inwardly of the drum 27 or 34 which carry digits in the unit place to illuminate the digits, and for this reason there are provided digit-transparent portions which indicate digits 25 and 35 as transparent figures. However, if required, the digits themselves need not be transparent, but portions 26 and 37.

It will be understood that the above description is merely illustrative of preferred embodiments of the invention. Additional modifications and improvements utilizing the discoveries of the present invention can be readily anticipated by those skilled in the art from the present disclosure, and such modifications and improvements may fairly be presumed to be within the scope and purview of the invention as defined by the claims that follow.

What is claimed is:

1. A UHF tuner channel indicating device comprising:
   a channel switching shaft;
   a rotary device including a first gear directly rotatable together with said channel switching shaft, and an indicator drive means including an indicator drive shaft transverse to said channel switching shaft, said indicator drive means having a crown gear in mesh with said first gear of said rotary device and said crown gear being fixed to said indicator drive shaft for driving said indicator drive shaft by said channel switching shaft;
   a first cylindrical indicating drum having an indication section on a peripheral surface thereof for indicating unit digits, said first cylindrical indicating drum being fixed for direct rotation with said indicator drive shaft;
   a second cylindrical indicating drum having an indication section on a peripheral surface thereof for indicating tens digits, said second cylindrical indicating drum having a diameter greater than that of said first drum and being mounted coaxially about said first cylindrical indicating drum with at least a portion of the peripheral surfaces of each of said first and second indicating drums being mutually overlapping with portions of the peripheral surface of at least one of said drums being transparent such that a two digit UHF channel indicating number is displayed, and said second indication drum being rotatable with respect to said indicator drive shaft; and
   intermittent gear means for operatively connecting said second drum to said indicator drive shaft for intermittently rotating said second indicating drum by transmitting the rotation of said indicator drive shaft to said second drum for only one-tenth of a turn of said crown gear, so that said UHF channel indicating number is progressively displayed as said channel switching shaft is turned.

2. A UHF tuner channel indicating device as set forth in claim 1, wherein said intermittent gear means comprises a gear sector provided on an internal side wall of said crown gear, a second gear formed at a lower portion of said second cylindrical indicating drum adjacent to said gear sector, and an intermittent feeding gear meshing with both said gear sector and second gear, said feeding gear having longer length teeth and shorter length teeth in alternate relation so that said longer length teeth mesh with said gear sector while said longer and shorter teeth mesh with said second gear for intermittently rotating said second indicating drum by one-tenth turn upon one turn of said crown gear.

3. A UHF tuner channel indicating device as set forth in claim 2, wherein said intermittent feeding gear is rotatably supported on a pin of a bracket, said bracket being located stationarily between said second cylindrical indicating drum and said crown gear.

4. A UHF tuner channel indicating device as set forth in claim 3, wherein said second drum for indicating tens digits includes said transparent portions for displaying said unit digits, said first drum having said units digits adjacent to said transparent portions of said second drum.

5. A UHF tuner channel indicating device as set forth in claim 4, wherein said tens digits and said transparent portions for displaying unit digits of said second drum are both transparent, said tens digits and said transparent portions being located on the outer peripheral surface of said second drum with the remaining portions thereof being opaque, and wherein said first drum includes portions corresponding to said tens digits on said second drum, said portions of said first drum and said unit digits of said first drum being semi-transparent with the remaining portions thereof being opaque.

6. A UHF tuner channel indicating device as set forth in claim 4, wherein an illuminating means is included inwardly of said first drum such that both unit and tens digits are illuminated through transparent portions of both said drums.

7. A UHF tuner channel indicating device as set forth in claim 1, wherein said first and second drums are each divided into a portion being provided with digits and a second portion adjacent thereto, said portions being disposed on the periphery of said drums in juxtaposition along the axis of said drums, and wherein said second drum indicates said tens digits on the left-hand half portion of the outer peripheral surface thereof with the remaining right-hand half portion being transparent, said transparent half portion being adapted to display unit digits of said first drum therethrough.

8. A UHF tuner channel indicating device as set forth in claim 7, wherein an illuminating means is included inwardly of said first drum such that both unit and tens digits are illuminated through transparent portions of both said drums.

* * * * *